United States Patent
Brandt

(10) Patent No.: US 7,268,618 B2
(45) Date of Patent: Sep. 11, 2007

(54) POWER AMPLIFIERS

(75) Inventor: Per-Olof Brandt, Lomma (SE)

(73) Assignee: Telefonktiebolaget LM Ericsson (publ), Stockholm (SE)

( * ) Notice: Subject to any disclaimer, the term of this patent is extended or adjusted under 35 U.S.C. 154(b) by 90 days.

(21) Appl. No.: 10/515,616

(22) PCT Filed: May 19, 2003

(86) PCT No.: PCT/EP03/05247

§ 371 (c)(1),
(2), (4) Date: May 25, 2005

(87) PCT Pub. No.: WO03/103109

PCT Pub. Date: Dec. 11, 2003

(65) Prior Publication Data

US 2005/0212601 A1  Sep. 29, 2005

Related U.S. Application Data

(60) Provisional application No. 60/388,172, filed on Jun. 11, 2002.

(30) Foreign Application Priority Data

May 31, 2002  (EP)  ................... 02253860

(51) Int. Cl.
*H03G 5/16* (2006.01)
(52) U.S. Cl. .................. 330/133; 330/200; 330/297
(58) Field of Classification Search ............... 330/133, 330/297, 200
See application file for complete search history.

(56) References Cited

U.S. PATENT DOCUMENTS

| | | | | |
|---|---|---|---|---|
| 4,442,407 A * | 4/1984 | Apel | .......................... | 330/128 |
| 4,547,746 A * | 10/1985 | Erickson et al. | ............ | 330/298 |
| 4,924,191 A | 5/1990 | Erb et al. | | |
| 5,442,322 A * | 8/1995 | Kornfeld et al. | ............ | 330/285 |
| 5,532,648 A | 7/1996 | Culling | | |
| 5,673,001 A | 9/1997 | Kim et al. | | |
| 6,008,698 A * | 12/1999 | Dacus et al. | ................. | 330/279 |
| 6,831,517 B1 * | 12/2004 | Hedberg et al. | ............ | 330/285 |
| 2001/0020870 A1 | 9/2001 | Laaser | | |
| 2003/0102924 A1 * | 6/2003 | Matsumoto et al. | ........ | 330/310 |

* cited by examiner

*Primary Examiner*—Patricia Nguyen
(74) *Attorney, Agent, or Firm*—Michael Cameron

(57) ABSTRACT

A method of controlling output power in a power amplifier having a driver stage and an output stage. The driver current is measured and the output stage biased in dependence upon the measured driver current.

8 Claims, 2 Drawing Sheets

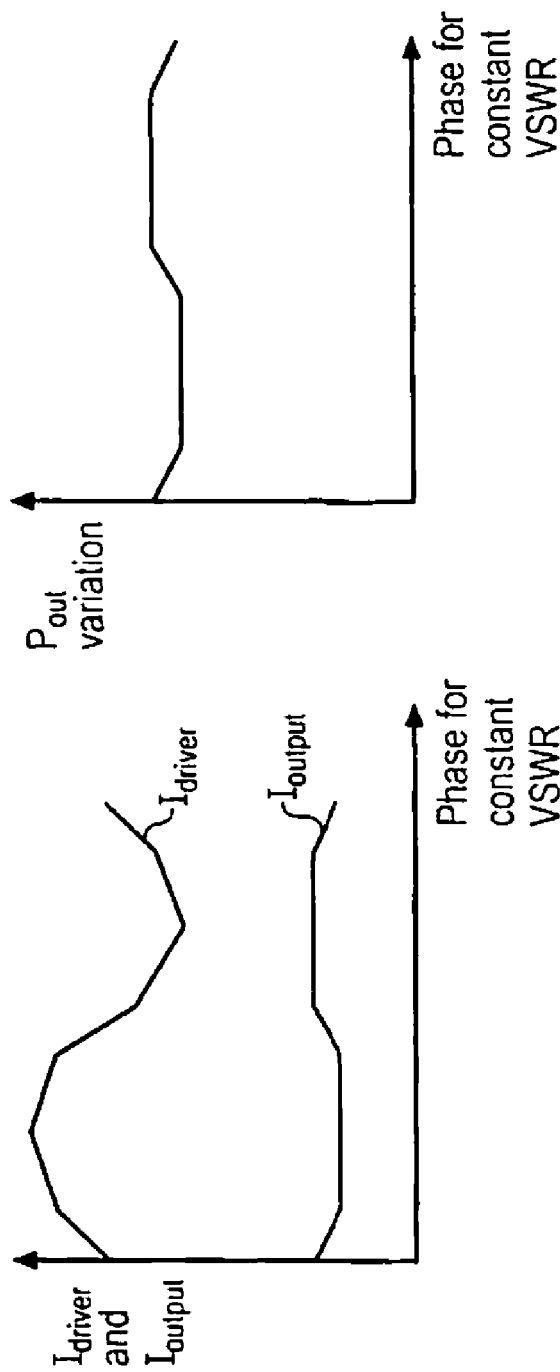

POWER AMPLIFIERS

This patent application claims the benefit of priority from U.S. Provisional Patent Application Ser. No. 60/388,172 filed on Jun. 11, 2002. This application incorporates by reference the entire disclosure of U.S. Provisional Patent Application Ser. No. 60/388,172.

BACKGROUND OF THE INVENTION

In GSM like systems, the output power in a transmit mode of the transmitter is controlled by a power amplifier (PA). Typically, power amplifiers are controlled by controlling the current drawn by the power amplifier. This current is proportional to the output power. Alternatively, other parameters proportional to the output power can be regulated.

By sensing the current supplied to the power amplifier, and feeding it back to an error amplifier for feedback to a control input of the power amplifier, the biasing of the power amplifier can be changed in order to regulate the output of the power amplifier. Typically a filter would be used in the feedback loop in order to limit the amount of noise introduced into the system.

However, the typical transfer function of the power amplifier, or its gain (control signal to current consumption or output power) is not constant. When a mismatch occurs at the antenna, the load on the power amplifier is changed. This also means that the output power error gets bigger for a given voltage standing wave ratio (VSWR) level. As mentioned above, typically the DC current supplied to the power amplifier is regulated, but this means that the relationship between power out and DC current is only known if the load at the output at the PA is constant. As the load of the antenna varies, the output power from the PA varies differently for different phases at high VSWR. For example, at VSWR 8:1 for the different phases of the output power could vary by as much as +/−9 dB if there were not other limitations that limit the power output. This can be shown to be the case due to the expression $P=I^2R_L/2$, where in real terms $R_L$ varies from 6.25 ohms to 400 ohms at VSWR8:1. Accordingly, if better control is required, then information about the output power or the reflected power has to be used instead of the total DC power supplied to the power amplifier.

SUMMARY OF THE PRESENT INVENTION

It is therefore desirable to obtain improved control of the output power with a varying load. This is especially the case with very narrow band antennas that can vary in band from 1:1 to 5:1 in VSWR.

According to the present invention, there is provided a method of controlling output power from a power amplifier, the method including measuring DC current supplied to a driver stage of the power amplifier and providing a bias control signal for the driver stage and an output stage of the power amplifier in dependence upon the measurement of the DC driver current.

It is emphasised that the term "comprises" or "comprising" is used in this specification to specify the presence of stated features, integers, steps or components, but does not preclude the addition of one or more further features, integers, steps or components, or groups thereof.

BRIEF DESCRIPTION OF THE DRAWINGS

FIG. 2 illustrates current and output signals from the circuit of FIG. 1.

DETAILED DESCRIPTION OF THE PREFERRED EMBODIMENT

Figure 1:
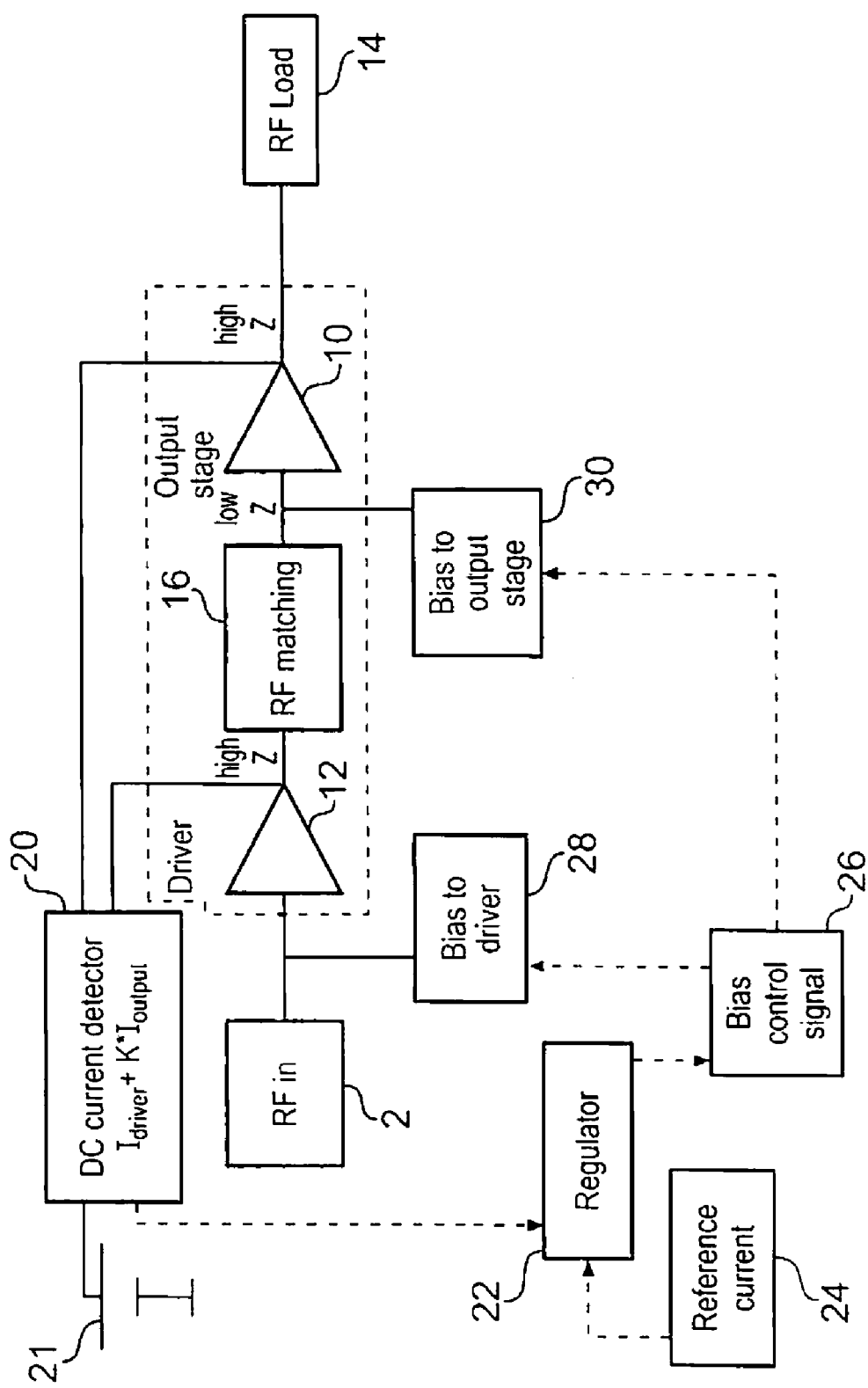
FIG. 1 illustrates a block diagram of a power amplifier circuit embodying present invention.

FIG. 1 is a block diagram illustrating a power amplifier circuit embodying the present invention. The circuit includes an RF input 2 which is connected to an output stage power amplifier 10 via a driver stage 12 and an RF matching stage 16. An output of the PA output stage 10 is connected to the RF load 14 (usually an antenna). In an embodiment of the present invention, a DC current detector 20 serves to detect the DC current supplied to both the driver stage 12 and the output stage 10. The current detector 20 is supplied by a battery 21. The DC current detector 20 produces an output signal equivalent to $I_{driver}+K*I_{output}$ for supply to a regulator 22. The choice of value for K is discussed below. The regulator 22 receives a reference current input 24 and it combines this with the output of the DC current detector 20 to produce a signal for supply to a bias control signal unit 26. The bias control signal unit 26 provides bias signals for the driver stage 12 and the output stage 10. These bias signals (28 and 30 respectively) serve to bias the input to the driver stage 12 and the output stage 10 respectively.

The output of the driver stage 12 is connected to the input of the output stage 10 by way of an RF matching circuit 16. The matching circuit is intended to match a low impedance of the output stage input to a higher load impedance at the output of the driver stage. The matching circuit should ideally be selected to have zero degrees phase shift, or such a phase shift that a high ohmic load at the output of the output stage transfers to a low ohmic load at the driver stage output.

Typically, the output transistor is an inverting component and a lower current swing (at higher ohmic loads) gives a lower in-phase feedback voltage to the input coming from the emitter inductance. A higher voltage swing at the output lowers the impedance through the capacitance between the base and emitter of the output stage. The feedback paths all work in the same direction so that a high ohmic load translates into a low ohmic load at the input and vice versa.

If the matching network between the input of the output transistor and the output of the driver stage is achieved with zero degrees phase shift, then a high ohmic load at the output transistor is translated to a low ohmic load at the driver stage. This means that for a high ohmic load at the output stage, the driver will have an increased DC current and the output stage will have a decreased DC current if the sum of them is kept constant. The output power can then be increased until either the voltage limit, the swing or until the current density in the driver limits the maximum current consumed, or until the total DC current is reached for small VSWR's. This situation can be very dramatic since at high VSWR the gain in the output stage can even be negative.

Accordingly, in embodiments of the present invention, the driver stage current is used to regulate (bias) the output stage and the driver stage, as described.

FIG. 2 illustrates that the driver current can be a better variable to control output power than the total current when the load varies. FIG. 2a illustrates the driver stage and output stage currents, whilst FIG. 2b illustrates the output power variation.

Ideally, both the driver stage and the output stage should be run in a saturated mode.

The DC current detector which outputs $I_{driver}+K*I_{output}$ should be such that K is chosen so that the output power of the output stage becomes ideally a straight line. K would typically be chosen dependent on many factors such as gain of the output stage and the efficiency in the various different stages of the amplifier.

The invention claimed is:

1. A power amplifier comprising:
   a driver stage having an input for receiving RF input signal, and an output for supplying a driver signal, an RF matching stage connected between the output of the driver stage and the input of the output stage;
   an output stage having an input for receiving a driver signal, and an output for supplying an RF output signal; and
   a bias control unit which is operable to measure electrical current supplied to the driver stage to produce a measured driver current value therefrom, and to supply a bias signal to the output stage in dependence upon the measured driver current value.

2. An amplifier as claimed in claim 1, wherein the bias control unit is operable to measure a current supplied to the output stage to produce a measured output current value therefrom, and to supply a bias signal to the output stage in dependence upon the measured driver current value and measured output current value.

3. An amplifier as claimed in claim 2, wherein the bias control unit is operable to supply a bias signal to the driver stage in dependence upon the measured driver current value and in dependence upon the measured output current value.

4. A power amplifier comprising:
   a driver stage having an input for receiving RF input signal, and an output for supplying a driver signal;
   an RF matching stage connected between the output of the driver stage and the input of the output stage, wherein the RF matching stage produces substantially 0°, of phase shift between the output of the driver stage and the input of the output stage,
   an output stage having an input for receiving a driver signal, and an output for supplying an RF output signal; and
   a bias control unit which is operable to measure electrical current supplied to the driver stage to produce a measured driver current value therefrom, and to supply a bias signal to the output stage in dependence upon the measured driver current value, wherein the bias control unit is also operable to apply a bias signal to the driver stage in dependence upon the measured driver current value.

5. An amplifier as claimed in claim 4, wherein the RF matching stage produces such a phase shift that a high ohmic load at the output of the output stage transfers to a low ohmic load at the driver stage output.

6. A power amplifier comprising:
   a driver stage having an input for receiving RF input signal, and an output for supplying a driver signal;
   an output stage having an input for receiving a driver signal, and an output for supplying an RF output signal; and
   a bias control unit which is operable to measure electrical current supplied to the driver stage to produce a measured driver current value therefrom, and to supply a bias signal to the output stage in dependence upon the measured driver current value and wherein the bias control unit is further operable to measure a current supplied to the output stage to produce a measured output current value therefrom, and to supply a bias signal to the output stage in dependence upon the measured driver current value and measured output current value.

7. A power amplifier comprising:
   a driver stage having an input for receiving RF input signal, and an output for supplying a driver signal;
   an output stage having an input for receiving a driver signal, and an output for supplying an RF output signal; and
   a bias control unit which is operable to measure electrical current supplied to the driver stage to produce a measured driver current value therefrom, and to supply a bias signal to the output stage in dependence upon the measured driver current value, wherein the bias control unit is further operable to measure a current supplied to the output stage to produce a measured output current value therefrom, and to supply a bias signal to the output stage in dependence upon the measured driver current value and measured output current value and wherein the bias control unit is further operable to supply a bias signal to the driver stage in dependence upon the measured driver current value and in dependence upon the measured output current value.

8. A power amplifier comprising:
   a driver stage having an input for receiving RF input signal, and an output for supplying a driver signal;
   an RF matching stage connected between the output of the driver stage and the input of the output stage, wherein the RF matching stage produces substantially 0°, of phase shift between the output of the driver stage and the input of the output stage,
   an output stage having an input for receiving a driver signal, and an output for supplying an RE output signal; and
   a bias control unit which is operable to measure electrical current supplied to the driver stage to produce a measured driver current value therefrom, and to supply a bias signal to the output stage in dependence upon the measured driver current value, wherein the bias control unit is also operable to apply a bias signal to the driver stage in dependence upon the measured driver current value, and wherein the bias control unit is further operable to measure a current supplied to the output stage to produce a measured output current value therefrom, and to supply a bias signal to the output stage in dependence upon the measured driver current value and measured output current value.

* * * * *

UNITED STATES PATENT AND TRADEMARK OFFICE
CERTIFICATE OF CORRECTION

PATENT NO. : 7,268,618 B2  
APPLICATION NO. : 10/515616  
DATED : September 11, 2007  
INVENTOR(S) : Brandt Page 1 of 1

It is certified that error appears in the above-identified patent and that said Letters Patent is hereby corrected as shown below:

On the Title page, Item (73), under "Assignee", Line 1, delete "Telefonktiebolaget LM Ericsson" and insert -- Telefonaktiebolaget LM Ericsson --, therefor.

In Column 1, Line 9, above "BACKGROUND OF THE INVENTION" insert -- The present invention relates to power amplifiers. --.

In Column 4, Line 41, in Claim 8, delete "RE" and insert -- RF --, therefor.

Signed and Sealed this

Eighth Day of July, 2008

JON W. DUDAS  
*Director of the United States Patent and Trademark Office*